United States Patent [19]
Hazelton et al.

[11] Patent Number: 6,114,781
[45] Date of Patent: Sep. 5, 2000

[54] COOLING SYSTEM FOR A LINEAR OR PLANAR MOTOR

[75] Inventors: Andrew J. Hazelton, San Carlos; John K. Eaton, Stanford, both of Calif.

[73] Assignee: Nikon Corporation, Japan

[21] Appl. No.: 09/259,465

[22] Filed: Feb. 26, 1999

[51] Int. Cl.⁷ .................................................. H02K 41/00
[52] U.S. Cl. ............................................. 310/12; 310/58
[58] Field of Search ................................ 310/12, 13, 14, 310/52, 54, 57, 58, 59, 60 R, 61, 62, 63, 60 A, 64

[56] References Cited

U.S. PATENT DOCUMENTS

| | | | |
|---|---|---|---|
| 4,445,056 | 4/1984 | Gaylord | 310/54 |
| 4,625,132 | 11/1986 | Chitayat | 310/13 |
| 4,749,921 | 6/1988 | Chitayat | 318/135 |
| 4,772,828 | 9/1988 | Heymans et al. | 318/128 |
| 4,839,545 | 6/1989 | Chitayat | 310/12 |
| 4,906,878 | 3/1990 | Twaalfhoven et al. | 310/12 |
| 4,916,340 | 4/1990 | Negishi | 310/12 |
| 5,073,734 | 12/1991 | Combette | 310/65 |
| 5,138,206 | 8/1992 | Schmidt | 310/12 |
| 5,477,304 | 12/1995 | Nishi | 355/53 |
| 5,482,919 | 1/1996 | Joshi | 310/52 |
| 5,528,118 | 6/1996 | Lee | 318/568.17 |
| 5,578,879 | 11/1996 | Heidelberg et al. | 310/54 |
| 5,623,175 | 4/1997 | Ronning et al. | 310/54 |
| 5,703,418 | 12/1997 | Assa | 310/12 |
| 5,715,037 | 2/1998 | Saiki et al. | 355/53 |
| 5,723,917 | 3/1998 | Chitayat | 310/12 |
| 5,751,077 | 5/1998 | Gonzalez | 310/12 |
| 5,773,837 | 6/1998 | Nakasuji | 250/412.23 |
| 5,783,877 | 7/1998 | Chitayat | 310/12 |
| 5,850,112 | 12/1998 | Sienz et al. | 310/12 |

*Primary Examiner*—Nestor Ramirez
*Assistant Examiner*—Judson H. Jones
*Attorney, Agent, or Firm*—Skerven, Morrill, MacPherson LLP; Norman R. Klivans

[57] ABSTRACT

An outer wall temperature of an enclosure containing a heat source, such as a coil array of a linear or planar motor, e.g. for driving a photolithography wafer positioning stage, is controlled by an insulating coolant flow in an intermediate channel. Laminar flow provides a thermal boundary layer having a thickness smaller than the channel height, which minimizes heat transfer, thereby effectively "insulating" the outer wall from the heat source. Excess heat is removed by turbulent coolant flow in a second channel. The two channels can be connected in series. Variations provide cooling of two-sided heat sources. To support the outer wall, posts extend through openings in the channel walls and are attached to a base plate. An insulating barrier surrounds each post in the turbulent flow channel, thereby minimizing heat transfer to the posts. To minimize turbulence in the insulating flow channel, the post has an airfoil shape.

42 Claims, 12 Drawing Sheets

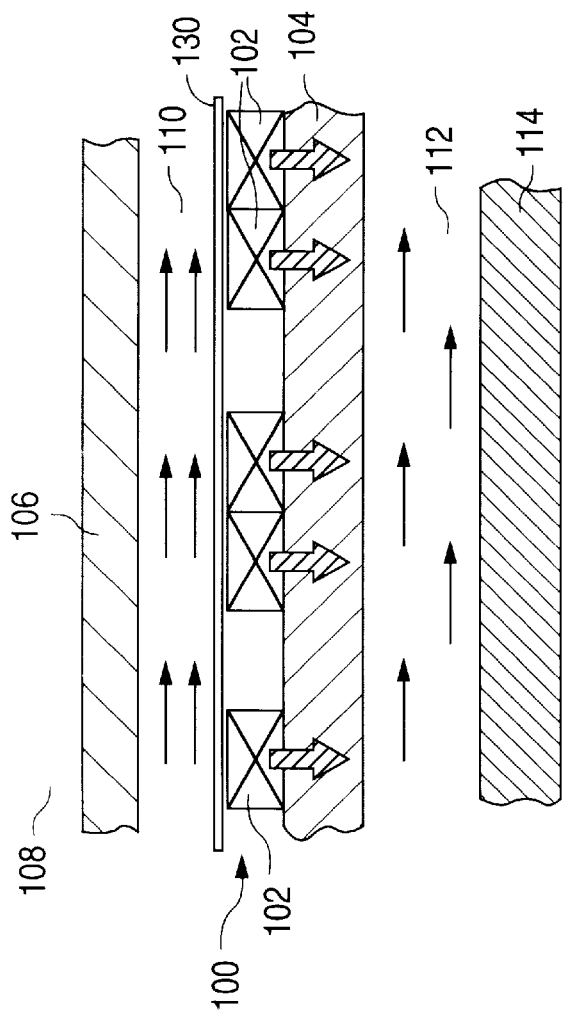
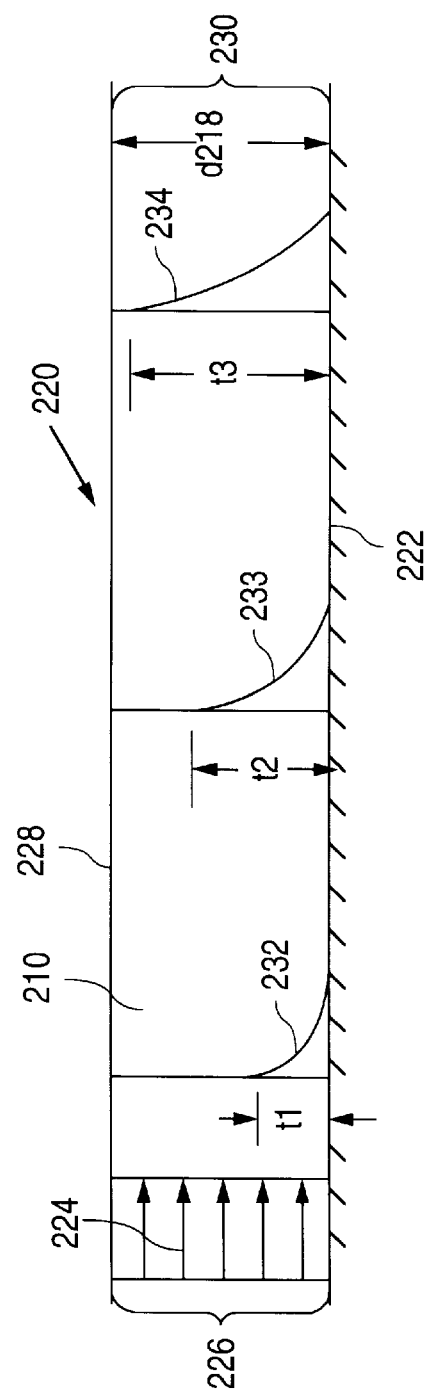
FIG. 1
FIG. 2A

COOLING SYSTEM FOR A LINEAR OR PLANAR MOTOR

FIELD OF THE INVENTION

The present invention is directed to the cooling of heat generating apparatus, including linear or planar electric motors. More particularly the invention relates to a structure for cooling the coil assembly of a linear or planar motor and preventing heating of the surrounding environment, such as in connection with a photolithographic system.

BACKGROUND

Linear and planar motors are used in machines for precise positioning of an object, for example an x-y stage. Excessive heating of the coils of a linear or planar motor causes an increase in the resistance of the coils, exacerbating the heat problem and reducing the performance of the motor. In addition, heat is carried away to the outside air and often to the rest of the machine in which the motor is utilized. Heat changes the index of refraction of air and consequently reduces the accuracy of laser interferometers and other optical systems, thereby degrading machine positioning accuracy. In addition, heat causes thermal expansion of machine components, resulting in inaccuracy of precision mechanical systems.

Most commercially available linear motors are not actively cooled. Typically the motor coils are encapsulated in a moderately thermally conductive epoxy, and the motor is cooled through heat convection from the epoxy encapsulant into the surrounding air.

U.S. Pat. No. 4,749,921 issued to Anwar Chitayat describes a linear motor, including a concept for cooling the linear motor coils. FIG. 8 in this patent shows a system of hollow tubes that are encapsulated with the coil assembly. Coolant can flow through these tubes, thereby providing cooling. U.S. Pat. No. 4,906,878 issued to Twaalfhoven et al., discloses a linear motor with cross-flow passageways or tubes connecting between inlet and outlet manifolds to remove heat from the motor coils.

Typical linear or planar motors that are not cooled operate inefficiently due to increased coil resistance with temperature increase, heating of surrounding air, and heating of surrounding machine elements as discussed above. Motors that are cooled only through a mounting bracket or other structural member do not provide direct cooling of the coils, allow parallel heat convection paths into the surrounding air, and accordingly suffer from similar disadvantages. The cooled motor of Chitayat U.S. Pat. No. 4,749,921 and others of the above-referenced patents require cooling passages to be created within the coil assembly. This is difficult and can typically be done only by wrapping the coils with tubing and encapsulating the assembly in an epoxy or other suitable encapsulant. This configuration also does not completely isolate the motor from the outside air, because the cooling tubes do not completely surround the coils. Coil heat may also be bypassed directly from the coil outer surfaces to the outside environment, resulting in performance degradation (for instance of metrological interferometry) of the machine in which the motor is utilized.

In conventional fluid cooling, the rate of heat removal W is given by the well-known expression:

$$W = c_p \rho v A \Delta T,$$

where $c_p$ is the specific heat of the coolant, $\rho$ is the mass density, v is the flow velocity, and $\Delta T$ is the temperature increase of the coolant, and A is the cross-sectional area of the flow channel. In terms of temperature increase $\Delta T$, this expression becomes:

$$\Delta T = W/c_p \rho v A.$$

Thus the conventional cooling arrangements, described for example in the Chitayat and Twaalfhoven et al. Patents cited above, rely on the heat capacity and flow rate of the coolant to limit the temperature rise of the motor. For example, FLUORINERT® type FC77 cooling fluid, manufactured by the 3M Company, can absorb 31 Watts per liter per minute of flow with a 1° C. temperature rise. For a typical linear motor, only 3 or 4 liters per minute of flow are required.

Whereas a linear motor provides motion in only one degree of freedom, a planar motor provides motion in three to six degrees of freedom with a single moving stage above a single fixed platen. One planar motor design generates 1500 Watts of heat, with a maximum temperature rise limitation of 0.1° C. This would require almost 500 liters per minute of flow, if the temperature rise is controlled conventionally using the heat capacity of the fluid, as with linear motors.

SUMMARY

This invention is directed to cooling structures and methods for heat generating apparatus, including linear and planar motor coil assemblies, such as those employed to drive photolithographic positioning stages.

In accordance with embodiments of the present invention, the temperature of an outer wall of an enclosure containing a heat generating source, e.g. the motor coil, is controlled by providing an insulating flow of coolant through a channel located between the heat generating apparatus and the outer wall. One side wall of the channel is provided by the outer wall, and the opposite side wall of the channel is provided by the surface of a thin sheet adjacent and in thermal communication with the heat generating apparatus.

The channel is configured for laminar flow of the coolant, such that the coolant has a thermal boundary layer adjacent the thin sheet. As the coolant flow progresses from the inlet end of the channel, the thickness of the thermal boundary layer grows toward the opposite outer wall. Channel geometry and coolant flow conditions are provided such that the thermal boundary layer thickness at the outlet end of the channel remains smaller than the height of the channel between the thin sheet and the outer plate. This condition minimizes the transfer of heat transversely through the coolant from the heat generating apparatus to the outer wall, thereby effectively "insulating" the outer wall from the heat source. Heat transferred into the coolant is removed in the coolant exhausted through the outlet end of the channel.

In various embodiments, the heat generating apparatus includes coil arrays (i.e. armatures) for planar or linear motors. In some embodiments, the outer wall is made of ceramic material, such as alumina. Alternatively, the outer wall is made of any suitably rigid structural material. To minimize turbulence, the thin sheet is made from, e.g. polyimide, polyester, nylon, or other suitable thin, smooth, polymer sheet or film. The coolant is, e.g. water, FLUORINERT® type FC77, or other commercially available liquid coolant.

In some embodiments, more heat must be removed than can be transferred into the insulating flow coolant alone. In accordance with the invention, the excess heat is removed by coolant flowing in a second channel on the opposite side of the heat generating apparatus from the insulating flow. In these embodiments, a second surface is located in thermal communication with and on the opposite side of the heat generating apparatus from the thin sheet. The second surface can be a surface of a backing plate to which a coil array is attached. Heat is transferred through the backing plate into a high heat transfer coolant flow in a second channel between the backing plate and a containment surface on a flow containment plate. The high heat transfer coolant flow is typically turbulent, to maximize heat transfer, which is generally higher than the heat transfer into the insulating flow. In some embodiments, the high heat transfer coolant has substantially the same composition as the insulating flow coolant. In some embodiments, the respective flow channels are configured such that the insulating flow and the high heat transfer flow are in series with one another.

In some embodiments, a substantially symmetric structure is provided for cooling a two-sided heat generating apparatus, for example a two-sided linear motor coil array. In such embodiments, a high heat transfer flow channel, as described above, is located on the inside between two portions of the heat generating apparatus. On the outside of each portion is located an insulating flow channel, as described above. Flowing coolants in the various channels provide substantially the same functions as described above. In some embodiments, two or more of the coolants in the various channels can have substantially the same composition.

In some embodiments, it is advantageous to support the outer wall to prevent excessive sag and to stiffen against low natural vibration frequency. In one embodiment, rigid, ceramic support members such as posts extend through openings in the backing plate and the flow containment plate, and are attached to a base plate. The base plate is at ambient temperature and is isolated thermally and mechanically from the heat generating apparatus and heat transfer fluids. A sealing barrier ring surrounds each post in the high heat transfer flow, thereby capturing a thermally insulating air space, isolating the post from the high heat transfer flow. Additionally, the interior of the barrier ring provides a drainage path for coolant from the insulating flow that leaks underneath the thin sheet. To minimize turbulence in the insulating flow in some embodiments, the portion of the support members passing through the insulating flow channel can have an airfoil shape.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent by referencing the accompanying drawings. For simplicity and ease of understanding, common numbering of elements within the illustrations is employed where an element is the same in different drawings.

FIG. 1 is a cross-sectional view of a coil array cooled according to principles of the present invention;

FIG. 2A is a cross-sectional diagram further illustrating the properties of an insulating flow, in accordance with the present invention;

DETAILED DESCRIPTION

Figure 2B:
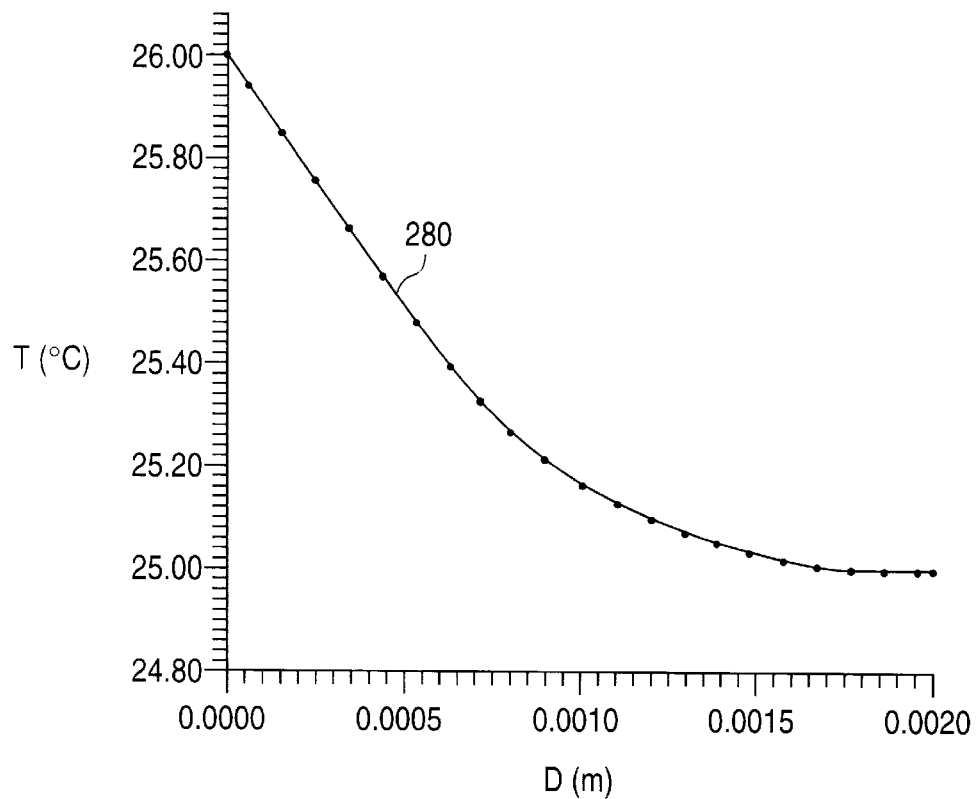
FIG. 2B is a graphical representation of the calculated temperature profile of the coolant across the outlet end of the channel.

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

FIG. 1 is a cross-sectional view of a linear motor coil array 100 cooled according to the present invention. In FIG. 1, the coils 102 (consisting of conventional insulated wire) are shown mounted on a backing plate 104. The material of backing plate 104 is iron or another material, as dictated by the motor design. The backing plate material preferably has a high thermal conductivity. Spaced above coils 102 is a ceramic outer plate 106. Outer plate 106 separates coils 102 from the ambient air 108 and generally has a maximum specified temperature rise above an ambient temperature. Typically outer plate 106 is ceramic for structural reasons, but alternatively is any suitably rigid material. Between coils 102 and outer plate 106 is a channel for an insulating flow 110 of coolant. The properties of insulating flow 110 are described in more detail below. Insulating flow 110 reduces heat transfer from coils 102 to outer plate 106. Underlying backing plate 104 is a channel for a lower flow of coolant 112. Lower flow 112 is separated from ambient air 108 by a lower flow containment surface, such as lower flow containment plate 114 substantially parallel to backing plate 104. In many applications, the maximum allowed temperature rise above ambient is relaxed for lower flow containment plate 114 relative to ceramic outer plate 106. This allows lower flow 112 to carry away significantly more heat than does insulating flow 110, as described below in more detail.

In some embodiments, backing plate 104 is not required, and coils 102 are supported in direct contact with lower flow 112 on a frame (not shown). Although insulating flow 110 and lower flow 112 are shown as aligned in the same direction (see arrows in FIG. 1), in other embodiments lower flow 112 can be oriented in a reverse direction, at right angles, diagonally, or in a combination of such directions relative to the direction of insulating flow 110. In embodiments in which minimal heat is generated by coils 102 or other heat generating apparatus, insulating flow 110 alone is adequate to remove the heat, so that lower flow 112 can be eliminated altogether.

FIG. 2A is a cross-sectional diagram further illustrating the properties of an insulating flow, in accordance with the present invention. In convective heat transfer, a cool fluid flow 210 in a direction 224 through a channel 220 between a warm wall 222 and a cool wall 228 creates a thermal boundary layer. Warm wall 222 is typically heated by conduction from a heat generating apparatus (not shown), for example a motor coil array (i.e. armature) as described in connection with FIG. 1. The thermal boundary layer extends from warm wall 222 into flow 210 toward cool wall 228. The boundary layer thickness gradually increases with distance along flow direction 224 from the entrance 226 to channel 220, as shown graphically by temperature profile representations 232–234 and corresponding boundary layer thicknesses t1–t3 superimposed from left to right within channel 220. If this boundary layer were to continue to grow until fully developed, it would then extend completely across channel 220. However, if at the outlet end 230 of channel 220, the boundary layer has not yet extended completely across channel 220, minimal heat is transferred across flow 210, and the temperature of cool wall 228 then remains near its original upstream temperature, which is typically significantly lower than the temperature of warm wall 222. In this fashion, flow 210 effectively "insulates" cool wall 228 from warm wall 222. The heat transferred from warm wall 222 into flow 210 to create the boundary layer is removed through the outlet end 230 of channel 220 by convection in flow 210.

To minimize boundary layer growth, the heat transfer fluid of flow 210 also preferably has a high Prandtl number, typically associated with low thermal diffusivity and slow boundary layer growth. The dimensionless Prandtl number Pr of a fluid is given by the well-known expression:

$$Pr = c_p \mu / k,$$

where $c_p$ is the specific heat capacity, $\mu$ is the viscosity as above, and k is the thermal conductivity of the fluid.

Importantly, flow 210 is substantially laminar (Reynolds number lower than approximately 2,300). This prevents mass transfer of warm fluid from warm wall 222 into flow 210 and the corresponding fast boundary layer growth of turbulent flows (Reynolds number higher than approximately 2,300). The dimensionless Reynolds number Re of a fluid flowing in a channel is given by the well-known expression:

$$Re = \rho h v / \mu,$$

where $\rho$ is the mass density and $\mu$ is the viscosity of the fluid, h is the hydraulic diameter of the channel, and v is the flow velocity. It is also important that the surfaces of channel 220 be as smooth as possible.

The thermal boundary layer thickness t(L) in a laminar flow as a function of the flow distance L within a channel is given by the well-known expression:

$$t(L) = C\sqrt{\alpha L / v},$$

where $\alpha$ is the thermal diffusivity of the fluid, v is the flow velocity, and C is a dimensionless parameter that is estimated or derived empirically for a particular configuration.

As a numerical example, the height D218 of channel 220 is taken to be 2.0 mm and the channel length L is taken to be 1.0 meter. The analysis assumes that the coolant is FLUORINERT® type FC77, as described above, having a thermal diffusivity $\alpha$ of $3.42 \times 10^{-8}$ m$^2$/sec, flowing at a rate v of 0.1 m/sec. The parameter C is estimated to be approximately 3. The flow velocity profile across the channel is assumed to be parabolic as predicted for laminar, hydrodynamically fully developed flow, and the inlet coolant temperature is taken to be 25° C. The original temperatures of warm wall 222 and cool wall 228 are taken to be respectively 26° C. and 25° C.

FIG. 2B is a graphic representation of the calculated temperature profile 280 of the coolant across the outlet end of channel 220. Temperature in degrees C. is shown along the vertical axis and distance in meters from warm wall 228 is shown along the horizontal axis of FIG. 2B. Adjacent to warm wall 222, the coolant temperature is 26° C. as expected. However, adjacent cool wall 228, the coolant temperature is still near the original temperature of 25° C., showing that the boundary layer has not grown completely across channel 220, flow 210 thereby maintaining its insulating property.

Figure 2C:
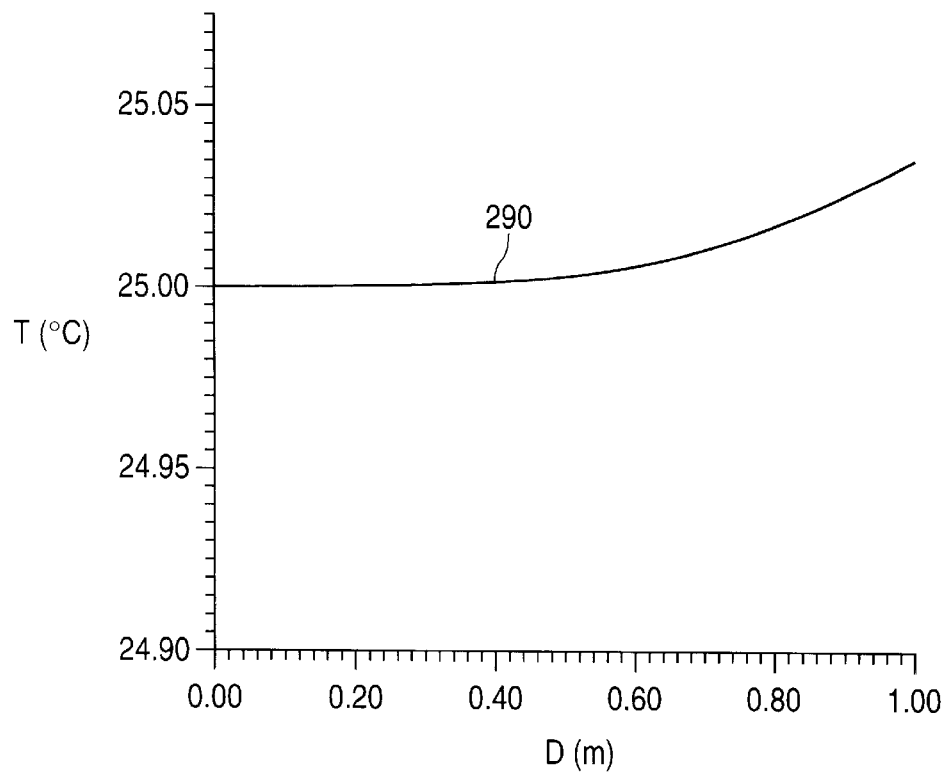
FIG. 2C is a graphical representation of the calculated temperature profile of the upper (cool) wall in degrees C. with distance parallel to the flow direction along the channel.

FIG. 2C is a graphic representation of the calculated temperature profile 290 of the upper (cool) wall 228 in degrees C. along the vertical axis with distance along the length of channel 220 in meters on the horizontal axis. At the outlet end 230 of channel 220 one meter from inlet end 226, the temperature of cool wall 228 has increased only slightly by 0.03° C., well within a typical requirement of 0.1° C. maximum, to 25.03° C. This result further illustrates the insulating properties of flow 210.

Using water as the coolant, having significantly higher thermal diffusivity $\alpha$ (water) of $1.44 \times 10^{-7}$ m$^2$/sec, the thermal boundary layer thickness t(L) at a given distance L would be approximately twice as great as that of FLUORINERT® type FC77. For the above examples, the Reynolds numbers using FLUORINERT® type FC77 and water respectively are approximately 240 and 170, both well within the range for laminar flow. Other coolants having differing properties, for example cooling oil and ethylene glycol, can also be used.

Referring again to FIG. 1, to minimize turbulence induced by surface irregularities of coils 102, a thin, smooth sheet 130 overlies and communicates thermally with coils 102, channeling insulating flow 110 between sheet 130 and outer plate 106. In some embodiments, sheet 130 is a sheet of polyimide film having a thickness of the order of approximately 50 microns. Alternatively sheet 130 is formed of a polymer such as nylon, polycarbonate, polyester, or other suitable thin, smooth material, for example ceramic. In other embodiments, sheet 130 is formed of a non-magnetic metal, such as 304 stainless steel. If the walls of coils 102 are reasonably smooth, sheet 130 is not required, and insulating flow 110 directly contacts the walls of coils 102.

In high power applications, lower flow 112 removes most of the heat conventionally at the temperature noncritical side of a heat generating apparatus, for example coils 102. Therefore lower flow 112 is preferably turbulent, thereby maximizing the heat transfer rate from coils 102 through backing plate 104 into the fluid. For added cooling capacity, the inlet fluid temperature in lower flow 112 can be colder than ambient temperature, thereby increasing the heat removing potential of lower flow 112.

In accordance with the invention, asymmetric heat transfer diverts heat generated by an apparatus, for example motor coils 102, away from temperature critical outer plate 106 and into lower flow 112. Insulating flow 110 carries away residual heat that is not transferred into lower flow 112, thus preventing heat from reaching outer plate 106 and causing a temperature rise that can be transferred into ambient air 108.

As an example, coils 102 generate approximately 1500 Watts of heat. If outer plate 106 is cooled by free convection heat transfer to ambient air 108 with a transfer coefficient of 5 W/m$^{2\circ}$ C. over an area of 1 m$^2$, then a maximum allowed temperature rise of 0.1° C. limits the allowed heat transfer through outer plate 106 to less than 0.5 watts. If the remainder, consisting of nearly all of the 1500 watts of generated heat, is carried away by convection using a typical coolant (FLUORINERT® type FC77) in a conventional configuration, as described above, a temperature rise limitation of only 0.1° C. would require a flow rate of 500 liters per minute. However, relaxing the allowed temperature rise from 0.1° C. to 1° C. on the noncritical side of the apparatus reduces the required fluid flow rate from 500 liters per minute to 50 liters per minute using FLUORINERT® type FC77. Using water as a coolant further reduces the required flow rate to approximately 22 liters per minute. Other coolants having differing properties will provide correspondingly differing results.

Thus, the present invention provides a fluid layer of insulation to limit the heat transfer and therefore the temperature rise on a temperature critical side of a heat generating apparatus. On the opposite, noncritical side of the apparatus, a larger temperature rise can be tolerated, permitting large convective heat removal at modest flow rates.

Figure 3A:
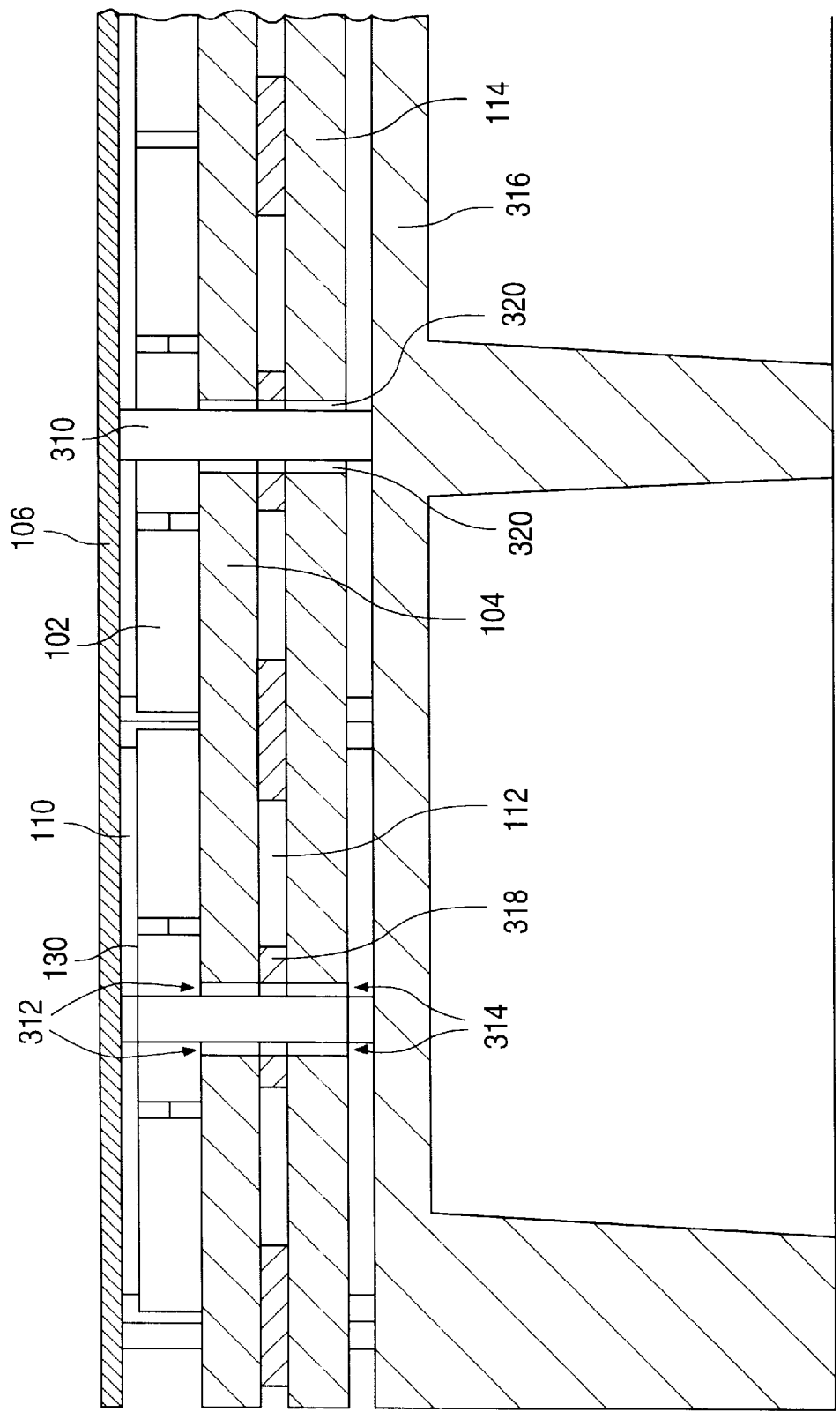
FIG. 3A is a cross-sectional view showing the outer plate supported using rigid, ceramic support posts, in an embodiment of the invention.

In some embodiments, it is advantageous to support outer plate 106 to prevent excessive sag and to stiffen against low natural vibration frequency. FIG. 3A is a cross-sectional view showing outer plate 106 supported using rigid, ceramic support members such as posts 310, in an embodiment of the invention. Attaching posts 310 directly to backing plate 104 could provide a mechanically rigid support but could also provide a thermal leakage path in either direction between coils 102 and outer plate 106, thereby allowing the temperature of outer plate 106 to increase or decrease by more than the specified amount.

In one embodiment, posts 310 extend through openings 312 in backing plate 104 and through openings 314 in lower flow containment plate 114, and are attached to a base plate 316. Base plate 316 is at ambient temperature and is isolated from the heat of coils 102 and heat transfer fluids 110, 112. A sealing barrier ring 318 confines a thermally insulating air space 320 surrounding post 310 within lower flow 112. Insulating air space 320 thermally isolates post 310 from lower flow 112 and minimizes heat transfer from lower flow 112 to post 310. Additionally, air space 320 surrounded by barrier ring 318 provides a drainage path for fluid from insulating flow 110 that leaks underneath sheet 130. Barrier ring 318 is preferably formed of thermally conducting material, thereby creating a thermally conductive path between backing plate 104 and lower flow containment plate 114. This thermally conductive path effectively increases the heat transfer surface area exposed to lower flow 112.

Figure 3B:
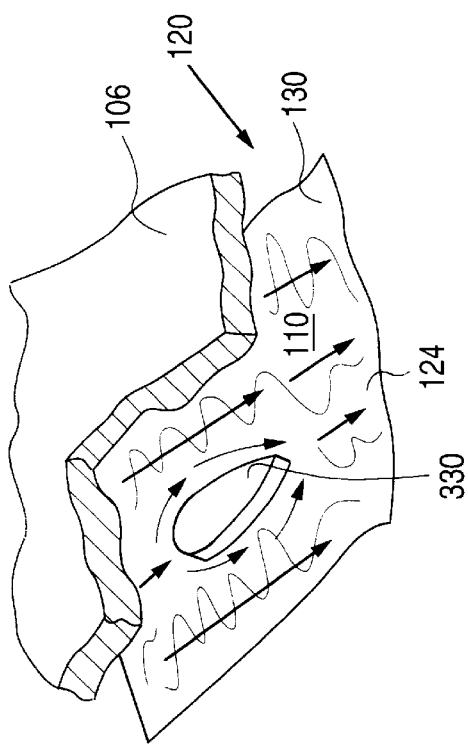
FIG. 3B is a cutaway view of an insulating flow channel containing an airfoil member supporting the outer plate.

To maintain the laminar properties of insulating flow 110, posts 310 cannot induce vortices or local areas of turbulence. Therefore, the cross section of the portion of post 310 in the insulating flow region 110 ideally resembles an airfoil. FIG. 3B is a cutaway perspective view of insulating flow channel 120 containing an airfoil member 330 supporting outer plate 106. Insulating flow 110 in the direction indicated by arrows 124 is channeled between outer plate 106 and sheet 130. Airfoil member 330 is aligned above post 310 (not shown in FIG. 3B) within insulating flow 110, such that airfoil member 330 rigidly supports outer plate 106 and minimizes disruption of insulating flow 110.

Figure 3D:
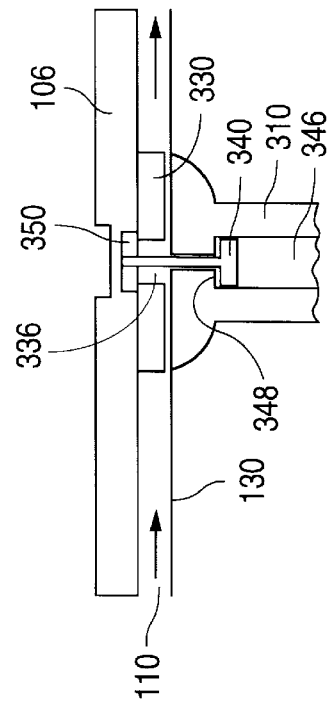
FIG. 3D is a cross-sectional detail view of an alternative method of fastening an airfoil member to a post within the insulating flow.
Figure 3C:
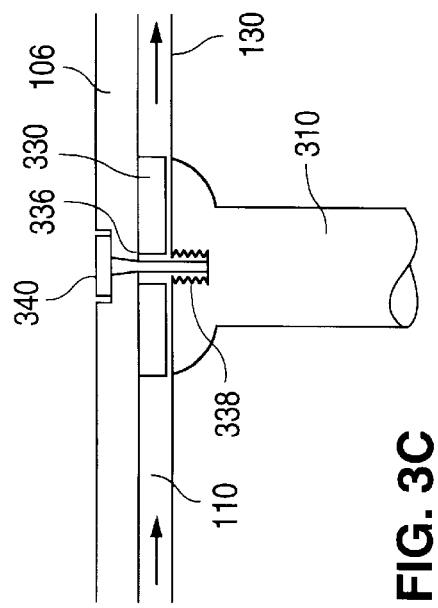
FIG. 3C is a cross-sectional detail view illustrating a method of fastening an airfoil member rigidly within the insulating flow between a post and the outer plate.

FIG. 3C is a cross-sectional detail view illustrating a method of fastening airfoil member 330 rigidly within insulating flow 110 between post 310 and outer plate 106. Clearance holes 336 are formed through outer plate 106, airfoil member 330, and sheet 130, and are aligned with a tapped hole 338 in the top end of post 310. A threaded bolt 340 is inserted from the top through clearance holes 336 and is tightened into tapped hole 338, thereby securing airfoil member 330 in alignment with post 310, sheet 130, and outer plate 106.

FIG. 3D is a cross-sectional detail view of an alternative method of fastening airfoil member 330 to post 310 within insulating flow 110. An inner longitudinal bore 346 having a shoulder 348 near the upper end is formed in post 310. Outer plate 106 is fitted with a threaded insert or bushing 350, which is then aligned with bore 346. Clearance holes 336 are formed through airfoil member 330 and sheet 130, and are aligned with bore 346 and bushing 350. A threaded bolt 340 is inserted from the bottom into bore 346 and through clearance holes 336, and is then tightened into bushing 350 in outer plate 106, thereby securing airfoil member 330 in alignment with post 310, sheet 130, and outer plate 106.

Figure 4A:
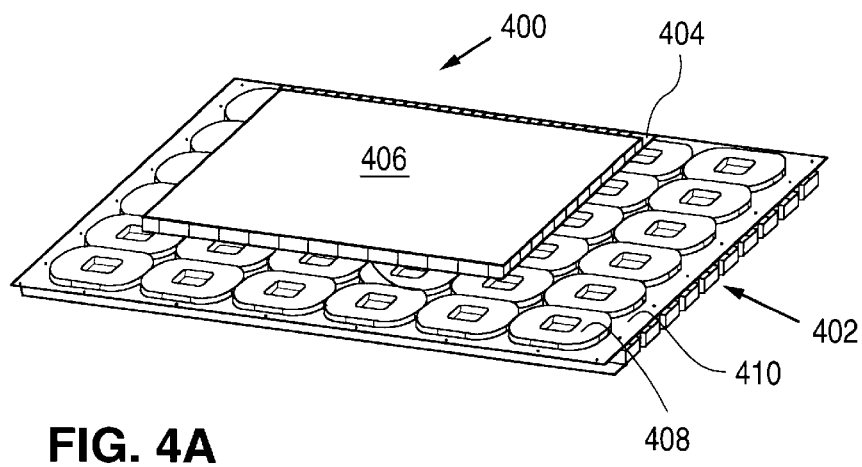
FIG. 4A is a perspective view of a moving magnet embodiment of a planar motor including a square flat planar coil array.

The particular coil array shown in FIGS. 1 and 3A is a square flat planar coil array similar to that described in Andrew J. Hazelton, Michael B. Binnard et al., "Electric Motors and Positioning Devices Having Moving Magnet Arrays and Six Degrees of Freedom", U.S. patent application Ser. No. 09/192,813, filed Nov. 16, 1998, incorporated herein by reference in its entirety and commonly assigned. FIG. 4A is a perspective view of a moving magnet embodiment of a planar motor 400 including such a square flat planar coil array 402. A magnet array 404 is attached to a moving portion of a positioning stage 406. Coils 408 of coil array 402 are attached to a fixed platen 410. In this embodiment, magnet array 404 is sized such that four groups of coils 408 (16 coils) fit underneath magnet array 404.

Coils 408 can be switched electrically such that only the coils that are underneath magnet array 404 and producing force are energized. The other coils are switched off to minimize heating of the system. In a version of planar motor 400 having three degrees of freedom, air bearings (not shown) are attached to the bottom of positioning stage 406, and a smooth, hard surface is provided over coil array 402. In a version of planar motor 400 having six degrees of freedom, no air bearings are included.

Figure 4B:
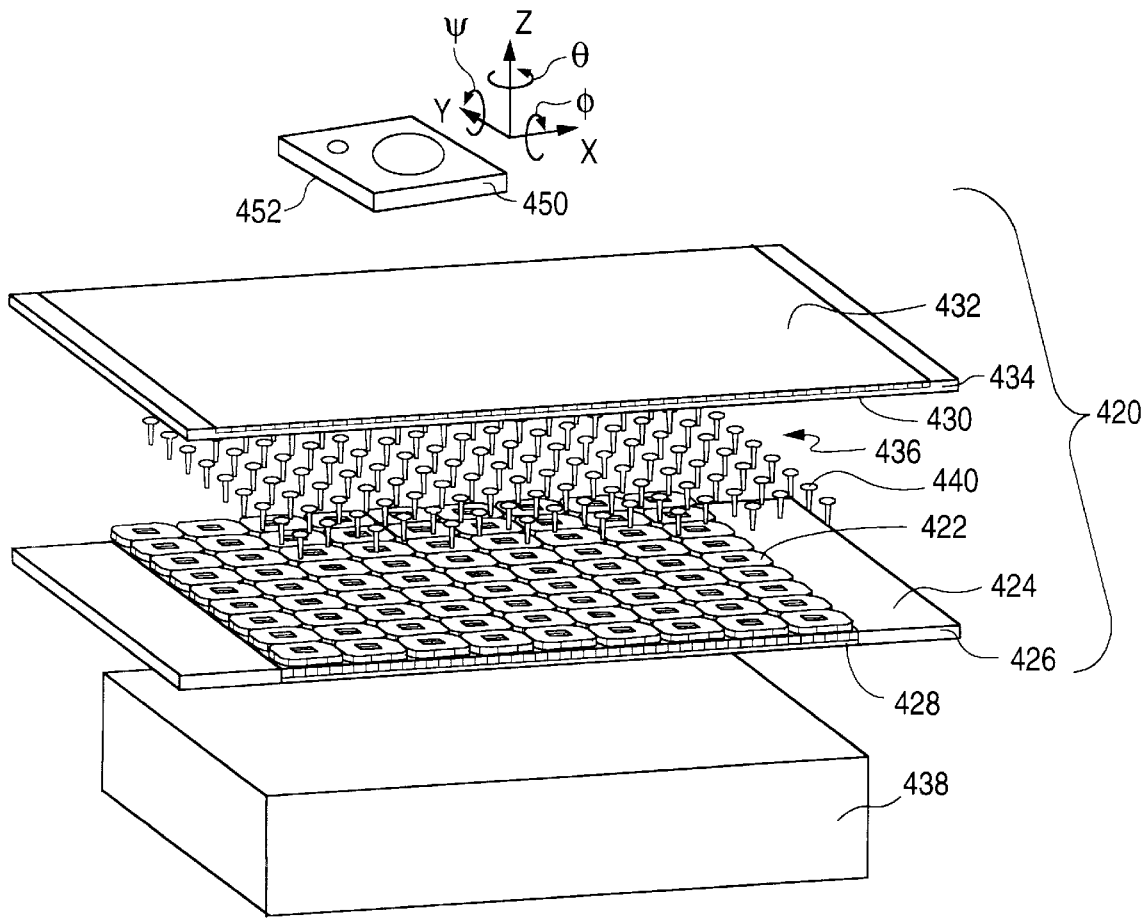
FIG. 4B is an exploded perspective view of a square flat planar coil array similar to that shown in FIG. 4A.

FIG. 4B is an exploded perspective view of a square flat planar coil array 420 similar to that shown in FIG. 4A, incorporating a cooling configuration in accordance with an embodiment of the present invention. Coil array 420 is similar to that described in Hazelton et al., "Reaction Force Isolation System for a Planar Motor", U.S. patent application Ser. No. 09/134,278, filed Aug. 14, 1998, incorporated herein by reference in its entirety and commonly assigned. Square flat coils 422 are attached and thermally contacted to a backing plate 424. Beneath backing plate 424 is a lower flow channel 426 defined by backing plate 424 and a lower flow containment plate 428.

A smooth, flat sheet 430 above coils 422, together with an outer plate 432, defines an insulating flow channel 434. A positioning stage 450 attached to a moving magnet array 452 rests on outer plate 432, typically supported by air bearings (not shown). Magnet array 452 is configured to provide a magnetic flux field that interacts with coil array 420 to produce forces to move positioning stage 450 in three degrees of freedom (conventionally designated X, Y, θ) or six degrees of freedom (conventionally designated X, Y, Z, θ, φ, ψ) above coil array 420. Outer plate 432 is made, e.g. of non-magnetic material, for example, 304 stainless steel, carbon-filled plastic, ceramic such as ZERODUR® ceramics, alumina ceramics, and the like materials that are mechanically rigid, smooth, and do not impair the magnetic flux of permanent magnets. Outer plate 432 is rigidly supported by an array of support posts 436. Support posts extend beneath outer plate 432 through openings in sheet 430, coils 432, backing plate 424, and lower flow containment plate 428, and are anchored to a thermally and mechanically isolated rigid base 438. In lower flow channel 426 each support post is surrounded by an insulating air space confined by a sealing barrier ring or block (not shown). At the top of each support post is an airfoil member 440, which is aligned within insulating flow channel 434, such that turbulence is minimized.

Figure 4C:
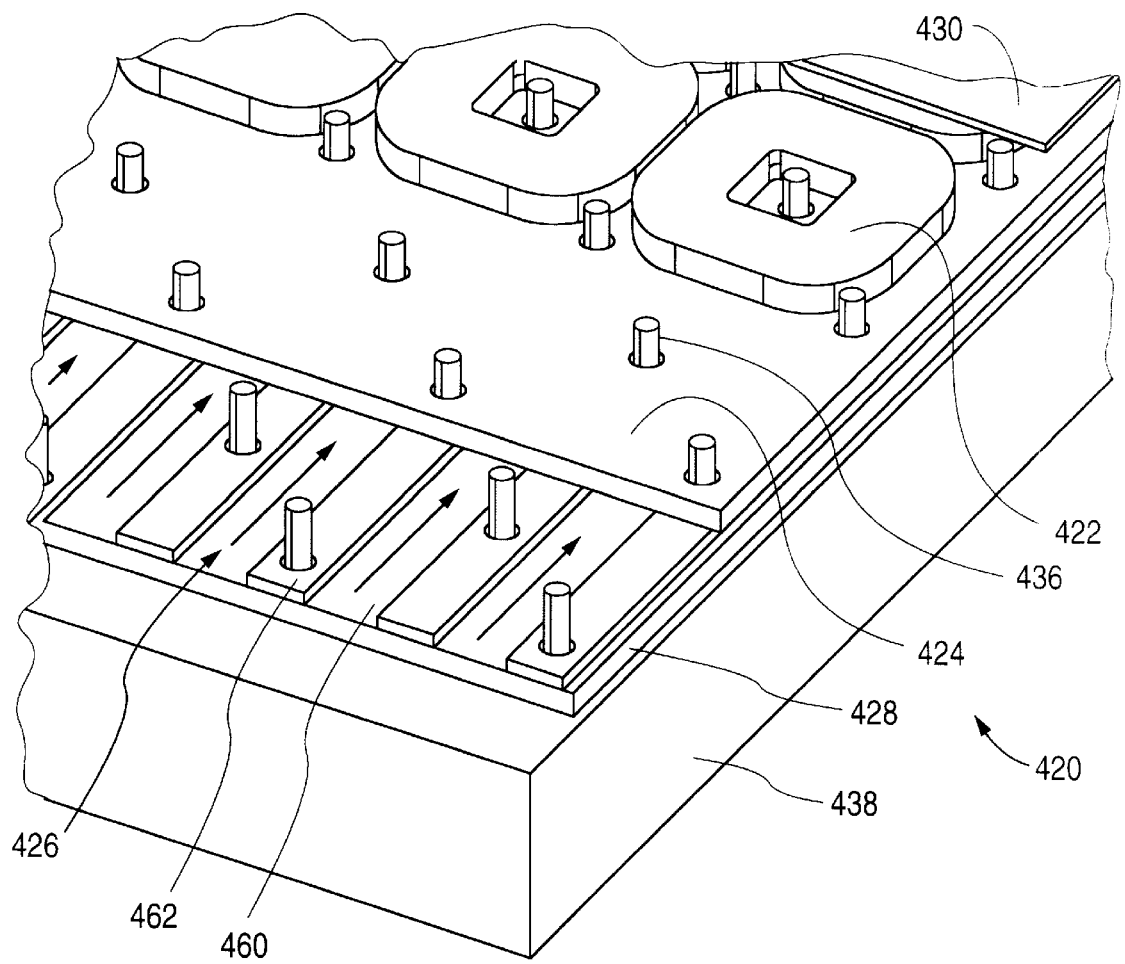
FIG. 4C is a partially cutaway perspective view of a variation of the planar coil array of FIG. 4B, showing details of the lower flow channel.

FIG. 4C is a partially cutaway perspective view of a variation of the planar coil array 420 of FIG. 4B, showing details of lower flow channel 426. Insulating flow channel 434, outer plate 432, and positioning stage are omitted for clarity in FIG. 4C. Square flat coils 422 are attached to backing plate 424 and underlie sheet 430. Lower flow channel 426 between backing plate 424 and lower flow containment plate 428 is defined by parallel flow channels 460 separated by parallel barrier strips 462. The inlet ends of parallel flow channels 460 are connected in parallel to a plenum (not shown). Support posts 436 (airfoil members not shown for clarity) are located at the center and adjacent to the four corners of each coil 422 and are configured to pass through openings in backing plate 424, lower flow containment plate 428, and barrier strips 462. Barrier strips 462 provide clearance for support posts 436 and extend vertically to fill the space between backing plate 424 and lower flow containment plate 428, thereby performing the function of a sealing barrier ring or block. Barrier strips 462 can be sealed along their edges with adhesive material; alternatively barrier strips 462 can be made of a resilient, self-sealing material, for example an elastomer such as an o-ring. Support posts 436 are anchored securely in rigid base 438, which is thermally and mechanically isolated from the rest of coil array 420.

Figure 4D:
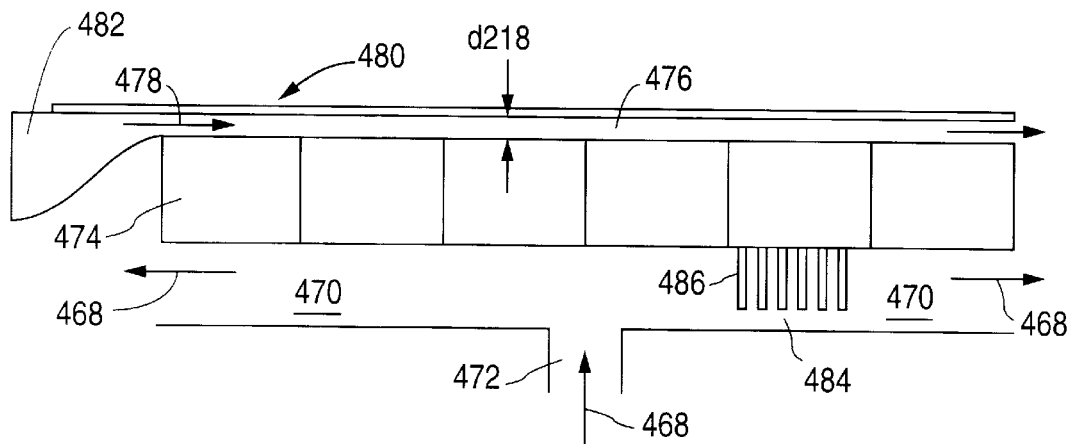
FIG. 4D is a cross-sectional view showing an embodiment of the invention having parallel lower flow channels branching from a common lower coolant inlet duct.

FIG. 4D is a cross-sectional view showing an embodiment of the invention having parallel lower flow channels 470 branching from a common lower coolant inlet duct 472. Arrows 468 show the coolant flow direction in lower flow channels 470 and inlet duct 472. Motor coils 474 are shown schematically above lower flow channels 470. An insulating flow channel 476 having a coolant flow direction 478 is shown between an outer plate 480 and motor coils 474. At the inlet end of upper flow channel 476 is an upper manifold 482, which supplies coolant to insulating flow channel 476. To minimize turbulence, the walls of upper manifold 482 preferably provide a smooth hydrodynamic transition into the inlet end of insulating flow channel 476. Not shown for clarity are a sheet and a backing plate in thermal contact with motor coils 474, separating motor coils 474 from insulating flow channel 476 and lower flow channel 470 respectively.

In some embodiments, lower flow channel 470 is provided with one or more heat sinks 484, as illustrated in FIG. 4D. Heat sinks 484 increase the effective surface area of lower flow channel 470 and promote turbulence, thereby increasing the heat transfer from motor coils 474 into the coolant flow within lower flow channel 470. Heat sinks 484 typically include fins 486, which can be oriented perpendicular as shown, parallel, or at other angles relative to flow direction 468.

Figure 4E:
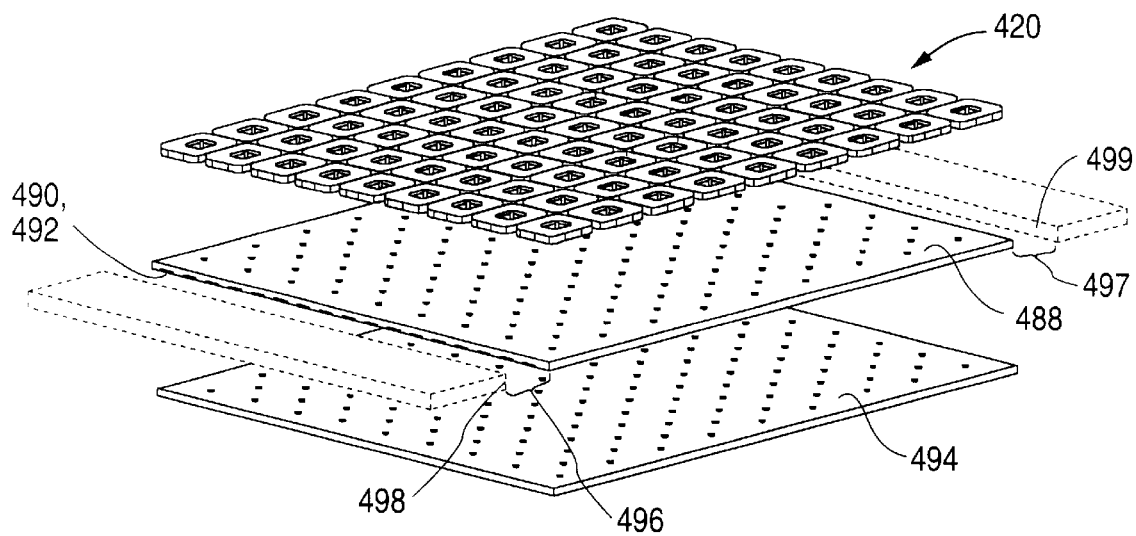
FIGS. 4E and 4F are exploded perspective views illustrating an embodiment having finned heat sinks.
Figure 4F:
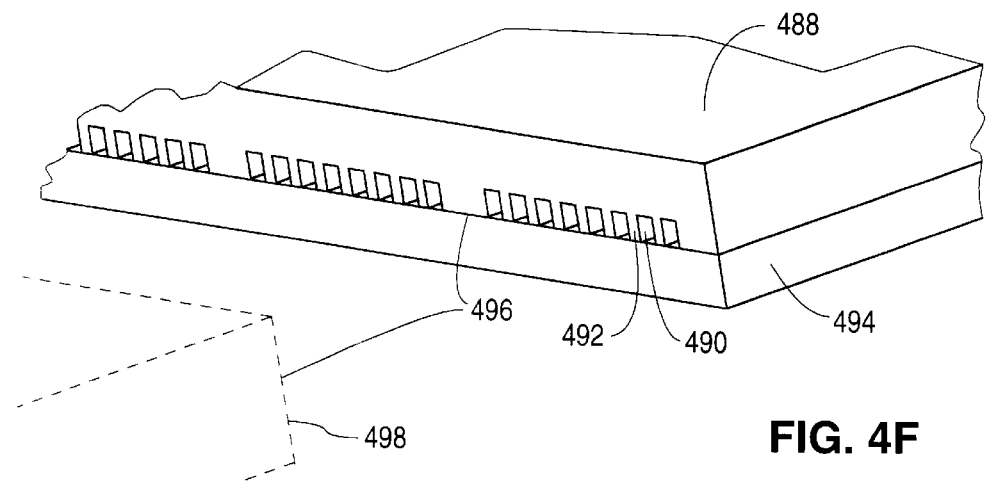

FIGS. 4E and 4F are exploded perspective views illustrating another embodiment effectively providing finned heat sinks. Coil array 420 is attached to the top surface of a backing plate 488, which is slotted to form parallel lower flow channels 490 between fins 492 (shown more clearly in the detail view of FIG. 4F). The bottom surfaces of backing plate 488 and fins 492 are sealed against the top surface of a lower flow containment plate 494 using a sealant (not shown), such as silicone rubber, or a gasket formed of a suitable elastomer. Coolant typically enters parallel lower flow channels 490 through a lower flow inlet plenum 496 formed between the inlet end of parallel lower flow channels 490 and an inlet plenum wall 498. Heated coolant exits through a lower flow outlet plenum 497 formed between the outlet end of parallel lower flow channels 490 and an outlet plenum wall 499.

Figure 4G:
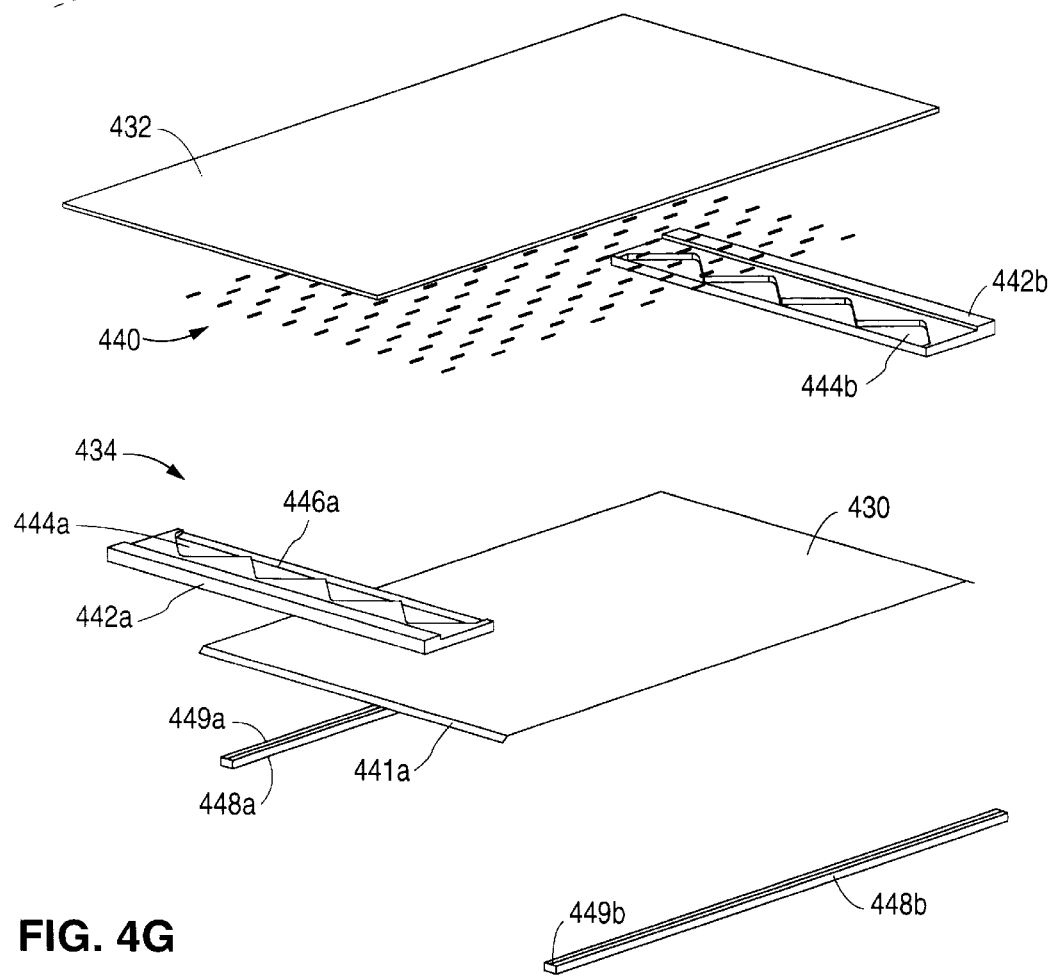
FIG. 4G is an exploded perspective schematic view of a portion of the planar coil array of FIG. 4B, showing details of the insulating flow channel.

FIG. 4G is an exploded perspective schematic view of a portion of an embodiment of planar coil array 420 of FIG. 4B, showing details of insulating flow channel 434 including sheet 430 and outer plate 432. Airfoil members 440 in insulating flow channel 434 are attached to outer plate 432 and to support posts (not shown) through sheet 430, thereby supporting outer plate 432 with minimal disturbance of the laminar flow properties in insulating flow channel 434. Coolant enters and exits insulating flow channel 434 through substantially symmetric inlet plenum 442*a* and outlet plenum 442*b*, respectively. Inlet and outlet plenums 442*a*, 442*b*, each include a row of substantially triangular flow conditioners 444*a* and 444*b*, respectively, each having an inlet port or outlet port (not shown) near their respective apices farthest from insulating flow channel 434. Each plenum 442*a*, 442*b* includes a ramp section 446*a* (446*b* not shown for outlet plenum 442*b*). When assembled, ramp section 446a of inlet plenum 442a is positioned under the end of sheet 430, where it is overlapped by a lip 441a. Outlet plenum 442b is assembled substantially symmetrically to the other end of sheet 430.

Rails 448a and 448b provide lateral support and sealing of insulating flow channel 434. Steps 449a, 449b respectively engage the lateral edges of sheet 430 and provide separation between sheet 430 and outer plate 432. The ends of rails 448a, 448b abut the ramp surfaces of plenums 442a, 442b, where they are affixed by a conventional sealant.

In addition to the above described embodiments, cooling configurations provided by the present invention can be applied to a three-servo planar coil array as described in Hazelton, "Compact Planar Motor Having Multiple Degrees Of Freedom," U.S. patent application Ser. No. 09/135,624 filed Aug. 17, 1998, commonly assigned, the specification of which is incorporated herein by reference in its entirety. Other configurations can be applied to linear motors or other heat generating apparatus.

Figure 5B:
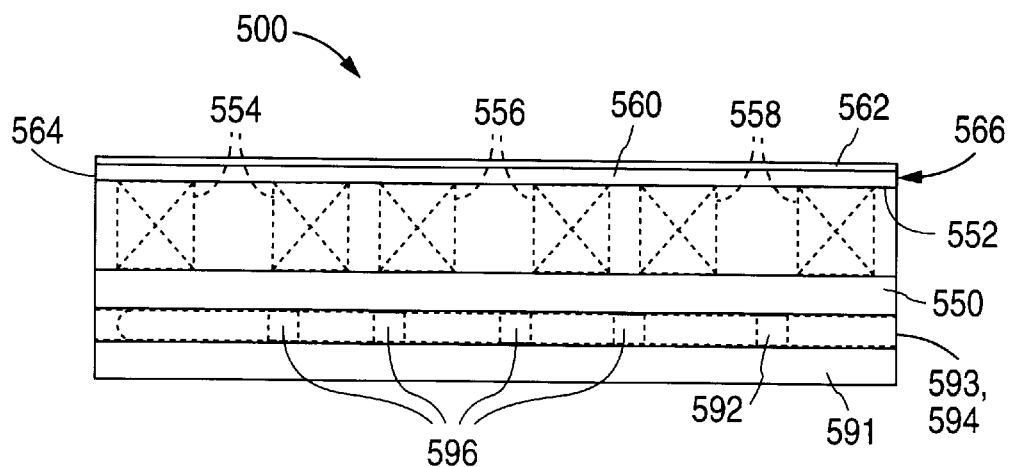
FIGS. 5A and 5B are plan and elevation views, respectively, of an embodiment of the present invention applied to a linear coil array.
Figure 5A:
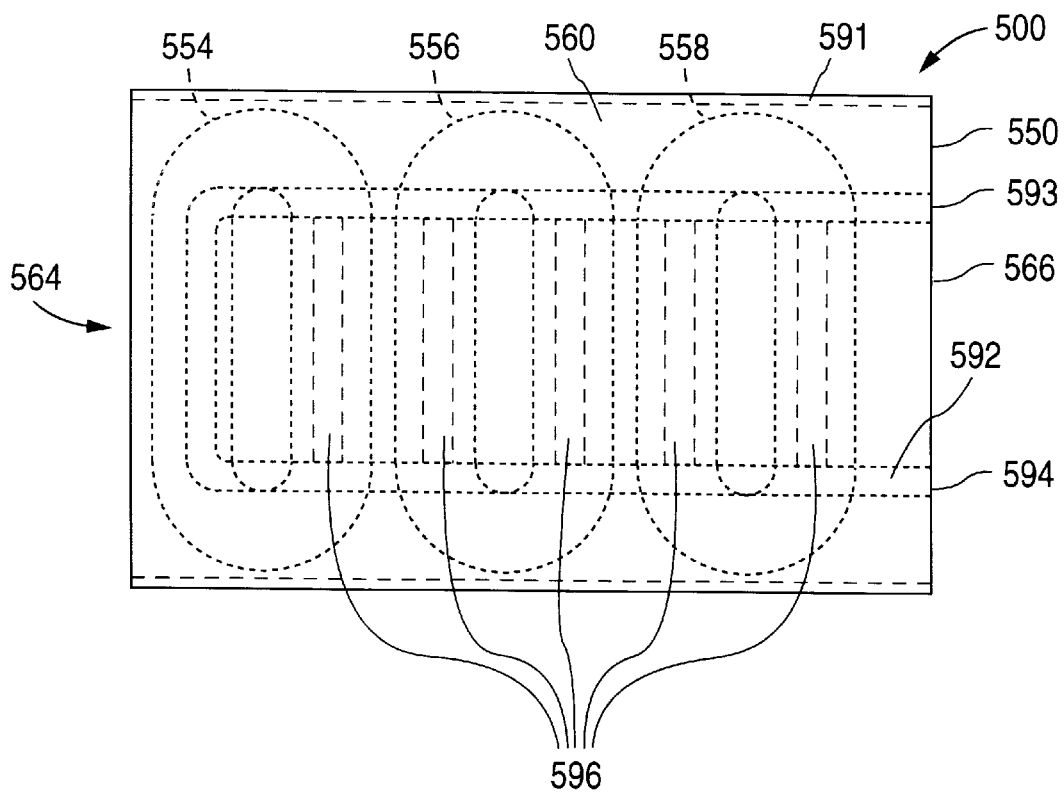

FIGS. 5A and 5B are plan and elevation views, respectively, of an embodiment of the present invention applied to a linear coil array 500 similar to that described in connection with FIGS. 7a and 7b of Chitayat, U.S. Pat. No. 5,723,917, issued Mar. 3, 1998. Linear coil array 500 includes coils 554, 556, and 558, mounted side-by-side onto a backing plate 550. Although coils 554, 556, 558 as shown in FIG. 5A have an oval shape, other coil shapes can be used, including polygonal shaped coils surrounding a void, as described for example in Hazelton et al., "Linear Motor Having Polygonal Shaped Coil Units", U.S. patent application Ser. No. 09/059,056 filed Apr. 10, 1998, commonly assigned, the specification of which is included herein by reference in its entirety. A lower flow channel 592 separates backing plate 550 from a lower flow containment plate 591. As illustrated in FIGS. 5A–5B, lower flow channel 592 includes an inlet port 593, an outlet port 594, and a plurality of parallel flow branches 596 located for optimal heat transfer proximate to the heat generating portions of respective coils 554, 556, 558. Other configurations can be used for lower flow channel 592, including single or multiple rectangular slots with or without finned walls.

Above coils 554, 556, 558 is a substantially planar sheet 552 of polyimide or other thin, smooth-surfaced material, separated by an insulating flow channel 560 from a substantially parallel flat outer plate 562 of ceramic or other suitable structural material. Insulating flow channel 560 typically extends over the entire area overlying coils 554, 556, 558, and is connected at its inlet end 564 and outlet end 566, respectively, to inlet and outlet plenums (not shown). The inlet and outlet plenums are shaped according to conventional hydrodynamic principles to promote laminar coolant flow through insulating flow channel 560.

In operation, coils 554, 556, 558 are selectively energized by electric current to apply force to a magnet array attached to a positioning stage (not shown), thereby moving the positioning stage relative to coils 554, 556, 558. Current through coils 554, 556, 558 generates heat, which is then removed by coolants flowing in insulating flow channel 560 and in lower flow channel 592. Particularly, the coolant flow in insulating flow channel 560 is substantially laminar, thereby minimizing the temperature rise on the temperature-critical surface of outer plate 562. The coolant flow in lower flow channel 592, on the other hand, is turbulent for maximum heat transfer. Most of the heat generated in coils 554, 556, 558 is thus carried away through lower flow channel 592. In some embodiments, the coolant in lower flow channel 592 is pre-chilled for increased heat transfer.

Figure 5C:
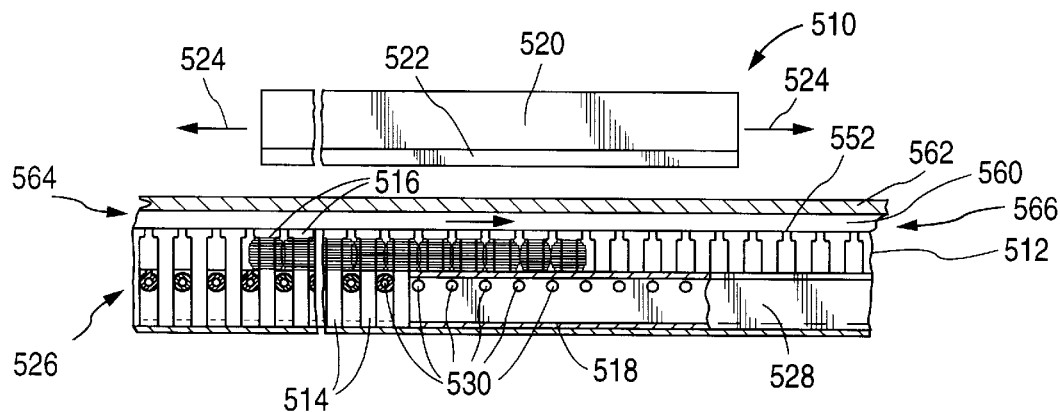
FIG. 5C is a cross-sectional side view of an embodiment of the present invention applied to a linear motor.

FIG. 5C is a cross-sectional side view of an embodiment of the present invention applied to a linear motor 510 similar to that described in connection with FIGS. 7–9 of Twaalfhoven et al., U.S. Pat. No. 4,906,878, cited above. Linear motor 510 includes a linear coil array 512 having a plurality of armature frames 514 on which coil windings 516 are wound. Linear coil array 512 is attached to a support frame 518. A linear magnet array 522 is attached to the bottom of a positioning stage 520, which is configured to move along the directions indicated by arrows 524 above linear coil array 512.

Across the top of linear coil array 512 is a substantially planar sheet 552 of polyimide or other thin, smooth-surfaced material, separated by an insulating flow channel 560 from a substantially parallel flat outer plate 562 of ceramic or other suitable structural material. Insulating flow channel 560 typically extends over the entire area overlying linear coil array 512 and is connected at its inlet end 564 and outlet end 566, respectively to inlet and outlet plenums (not shown). The inlet and outlet plenums are shaped according to conventional hydrodynamic principles to promote laminar coolant flow through insulating flow channel 560.

Integral with support frame 518 is a network of lower flow channels 526, including a lower flow inlet plenum 528, a lower flow outlet plenum (not shown), and crossflow branch tubes 530. Armature frames 514 extend between and alternate with crossflow branch tubes 530 to provide efficient heat transfer. The cross-sectional shape of crossflow branch tubes 530 can be round, as illustrated in FIG. 5C, or can be rectangular to more completely fill the spaces between armature frames 514, thereby transferring heat more efficiently. The inner surfaces of crossflow branch tubes 530 can contain fins, ridges, or other structures to induce turbulence and increase surface area, further increasing heat transfer efficiency.

In operation, linear coil array 512 is selectively energized by electric current to apply force to magnet array 522, thereby moving positioning stage 520 relative to coil array 512. Current through coil windings 516 generates heat, which is then removed by coolants flowing in insulating flow channel 560 and in lower flow channels 526. Particularly, the coolant flow in insulating flow channel 560 is substantially laminar, thereby minimizing the temperature rise on the temperature-critical surface of outer plate 562. The coolant flow in lower flow channels 526, on the other hand, is turbulent for maximum heat transfer. Most of the heat generated in coil array 512 is thus carried away through lower flow channels 526. In some embodiments, the coolant in lower flow channels 526 is pre-chilled for increased heat transfer.

Figure 6A:
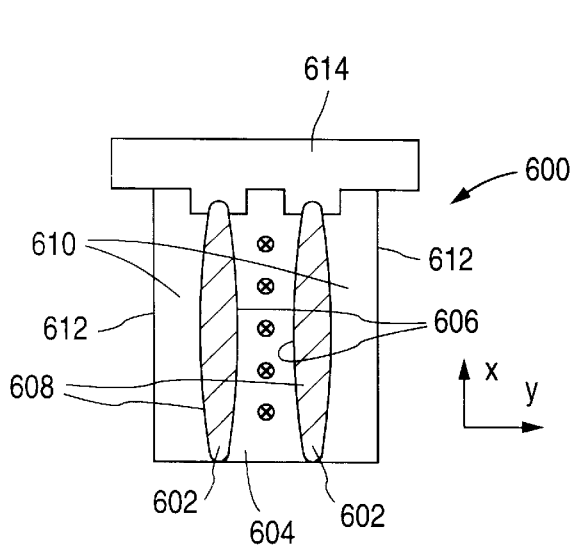
FIG. 6A is a cross-sectional end view of a cooling configuration according to an embodiment of the invention applied to a symmetric two-sided linear coil array.
Figure 6B:
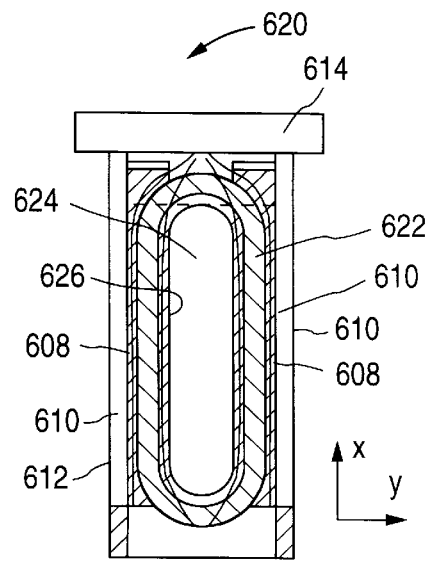
FIGS. 6B and 6C are respectively a cross-sectional end view and a partially cutaway side view of another coil array variation of the symmetric two-sided embodiment of FIG. 6A.
Figure 6C:
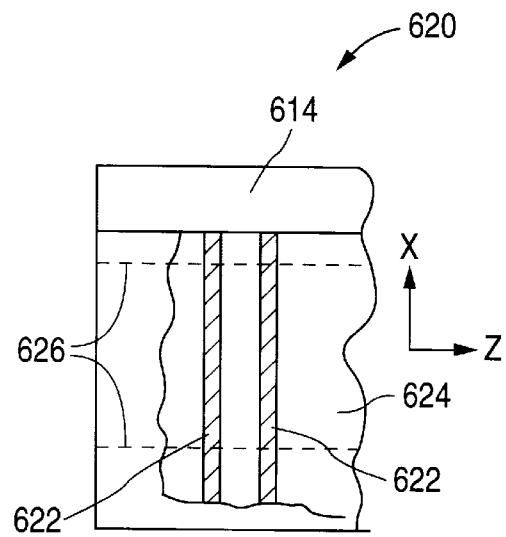

FIG. 6A is a cross-sectional end view of a cooling configuration according to an embodiment of the invention applied to a symmetric two-sided linear coil array 600. FIGS. 6B and 6C are respectively a cross-sectional end view and a partially cutaway side view of another coil array variation 620 of the symmetric two-sided embodiment of FIG. 6A.

Referring to the end view of FIG. 6A, coil array 600 includes linear motor coils 602 arranged symmetrically on either side of a high heat transfer flow channel 604. The inner surfaces 606 of coils 602 are each mounted to backing plates (not shown for clarity), which provide the side walls of high heat transfer flow channel 604. Substantially planar sheets of polyimide or other suitable thin, smooth material (not shown) cover the outer surfaces 608 of coils 602 and provide inner walls for insulating flow channels 610. Substantially flat, parallel outer plates 612 of ceramic or other suitable nonmagnetic structural material provide outer walls for insulating flow channels 610. Coils 602, high heat transfer flow channel 604, insulating flow channels 610, and outer plates 612 are rigidly anchored to a support frame 614.

High heat transfer flow channel 604 has an inlet end connected to an inlet plenum (not shown) and an outlet end connected to an outlet plenum (not shown). Likewise, insulating flow channels 610 each have an inlet end connected to an inlet plenum (not shown) and an outlet end connected to an outlet plenum (not shown).

Coils 602 can have substantially planar windings oriented such that the plane or a coil 602 is parallel to the x-z plane (normal to the plane of the figure). The coil windings can surround a central void and can be oval shaped or polygonal shaped (see for example Hazelton et al., U.S. patent application Ser. No. 09/059,056 cited above).

Referring to FIGS. 6B and 6C, a coil array variation 620 is configured similarly to coil array 600, except that the coils 622 have substantially planar windings and are stacked in the z-direction such that the plan of a coil 622 is parallel to the x-y plane. The coil windings can surround a central void and can be oval shaped or polygonal shaped (see for example Hazelton et al., U.S. patent application Ser. No. 09/059,056 cited above). A duct 626 extends through the central voids in thermal contact with the inside surfaces of stacked coils 622, thereby providing containment walls for a high heat transfer flow channel 624.

Substantially planar sheets of polyimide or other suitable thin, smooth material (not shown) cover the outer surfaces 608 (not shown in FIG. 6C) of coils 622 and provide inner walls for insulating flow channels 610 (not shown in FIG. 6C). Substantially flat, parallel outer plates 612 (not shown in FIG. 6C) of ceramic or other suitable nonmagnetic structural material provide outer walls for insulating flow channels 610. Coils 622, high heat transfer flow channel 624, insulating flow channels 610, and outer plates 612 are rigidly anchored to a support frame 614. High heat transfer flow channel 624 has an inlet end connected to an inlet plenum (not shown) and an outlet end connected to an outlet plenum (not shown). Likewise, insulating flow channels 610 (not shown in FIG. 6C) each have an inlet end connected to an inlet plenum (not shown) and an outlet end connected to an outlet plenum (not shown).

In operation, coils 602, 622 are selectively energized by electric current to apply force to magnet arrays (not shown). Current through coils 602, 622 generates heat, which is then removed by coolants flowing in insulating flow channels 610 and in high heat transfer flow channels 604, 624. Particularly, the coolant flow in insulating flow channels 610 is substantially laminar, thereby minimizing the temperature rise on the temperature-critical surface of outer plates 612. The coolant flow in high heat transfer flow channels 604, 624, on the other hand, is turbulent for maximum heat transfer. Most of the heat generated in coil array 512 is thus carried away through high heat transfer flow channels 604, 624. In some embodiments, the coolant in high heat transfer flow channels 604, 624 is pre-chilled for increased heat transfer.

Figure 7:
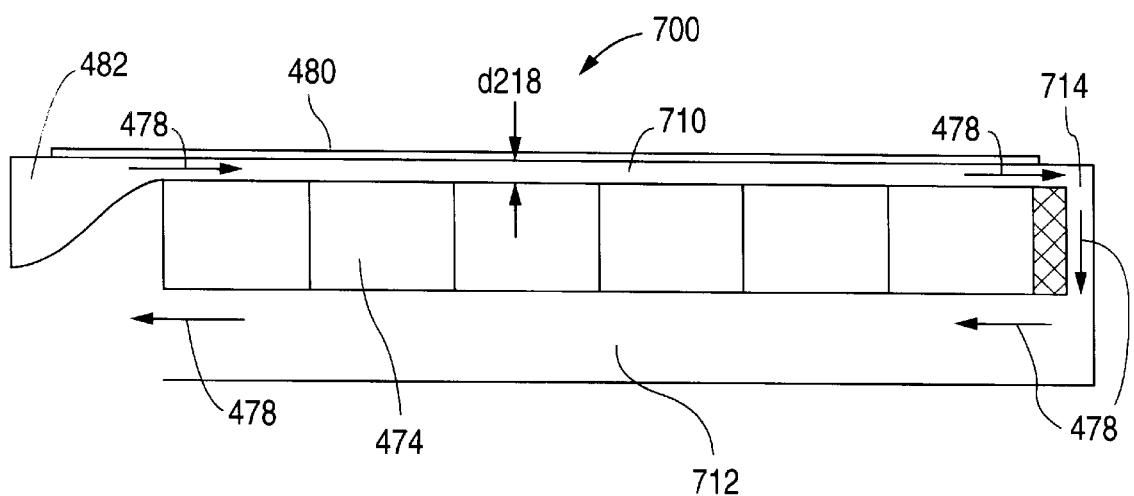
FIG. 7 is a cross-sectional view of a cooling configuration in accordance with an embodiment of the invention, having an insulating flow in series with a lower flow.

FIG. 7 is a cross-sectional schematic view of a cooling configuration 700 in accordance with an embodiment of the invention, having an insulating flow 710 in series with a lower flow 712. Coolant is directed first through insulating flow 710 and then through lower flow 712 by way of a connecting channel 714. This flow sequence can be applied to asymmetric coil array configurations, as illustrated in FIGS. 1, 3A, 4C, 4D, and 5A–5C, and to two-sided symmetric coil array configurations, as illustrated in FIGS. 6A–6C. Advantages provided by this series flow sequence include simplicity of structural and coolant configuration, including pumps, chillers, and piping. Disadvantages include inability to select coolant types, flow rates, inlet temperatures, and/or other properties of insulating flow 710 independently of lower flow 712.

Figure 8:
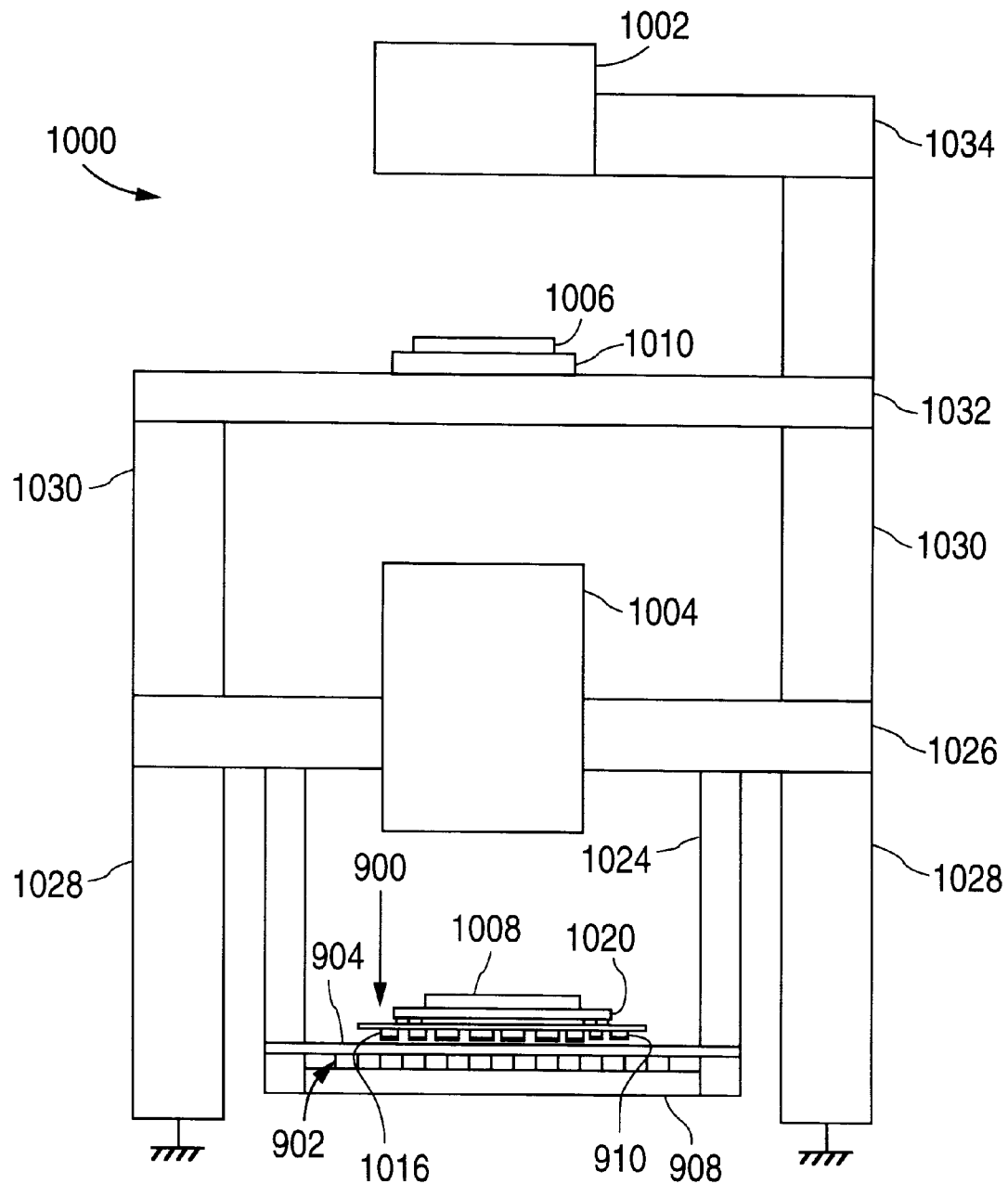
FIG. 8 is a schematic view illustrating a photolithographic instrument incorporating a wafer positioning stage driven by a linear motor coil array or planar motor coil array in accordance with present invention

FIG. 8 is a schematic view illustrating a photolithographic instrument 1000 incorporating a wafer positioning stage driven by a linear motor coil array or planar motor coil array in accordance with present invention. Examples of photolithographic instruments that can incorporate a linear or planar motor of the present invention are described in Hazelton et al., U.S. application Ser. No. 09/168,694, filed Oct. 2, 1998; Nakasuji, U.S. Pat. No. 5,773,837; Nishi, U.S. Pat. No. 5,477,304; Saiki et al., U.S. Pat. No. 5,715,037; and Lee, U.S. Pat. No. 5,528,118; all commonly assigned, the specifications of all of which are incorporated herein by reference in their entirety.

Referring to FIG. 8, photolithographic instrument 1000 generally comprises an illumination system 1002 and a linear or planar motor 900 for wafer support and positioning. Illumination system 1002 projects radiant energy (e.g. light) through a mask pattern (e.g., a circuit pattern for a semiconductor device) on a reticle 1006 that is supported and scanned using a stage 1010. Reticle stage 1010 is supported by a frame 1032. The radiant energy is focused through a system of lenses 1004 supported on a frame 1026, which is in turn anchored to the ground through a support 1028. Lens system 1004 is also connected to illumination system 1002 through frames 1026, 1030, 1032, and 1034. The radiant energy exposes the mask pattern onto a layer of photoresist on a wafer 1008.

Wafer 1008 is supported by and scanned using a wafer stage 1020 that is in turn supported and positioned by linear or planar motor 900. Motor 900 comprises a moving magnet array 910 and a fixed coil array 902. Alternatively motor 900 comprises a moving coil array and a fixed magnet array. Although photolithographic instrument 1000 is shown as incorporating a planar motor in which a permanent magnet array is attached to the moving stage, the photolithographic instrument can be adapted to incorporate a moving coil planar motor or other variations of planar or linear motor. Wafer stage 1020 and moving magnet array 910 are supported by air bearings 1016 on a top plate 904. The wafer positioning stage assembly, including a base 908, is connected to frame 1026 through frame 1024.

A similar planar or linear motor can be used in reticle stage 1010. Details of the implementation are not shown, but, given the disclosure herein, a person skilled in the art can implement a planar or linear motor in reticle stage 1010 without undue experimentation.

It is to be understood that a photolithographic instrument may differ from the one shown herein without departing from the scope of the invention. It is also to be understood that the application of the planar motor or linear motor of the present invention as disclosed herein is not to be limited to wafer processing apparatus.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

We claim:

1. An apparatus comprising:
    a first heat generating source located in thermal communication with a first channel;
    said first channel having a length and first and second sides and being adapted for a first coolant flowing within said first channel between said first and second sides;
    said first coolant having a thermal boundary layer adjacent said first side; and
    said thermal boundary layer having a thickness over the length of said first channel less than the distance between said first side and said second side.

2. The apparatus of claim 1, further comprising a second channel in thermal communication with said first heat generating source, said first heat generating source located between said first channel and said second channel, said second channel being adapted for a second coolant flowing within said second channel.

3. The apparatus of claim 2, wherein said first channel and said second channel are configured such that said first coolant and said second coolant flow in series through said first channel and then through said second channel.

4. The apparatus of claim 2, wherein said second channel is configured for higher heat transfer than said first channel from said first heat generating source.

5. The apparatus of claim 1, wherein said first heat generating source includes a motor coil array selected from the group consisting of linear motor coil arrays and planar motor coil arrays.

6. The apparatus of claim 2, further comprising:
    a second heat generating source located between and in thermal communication with said second channel;
    a third channel in thermal communication with said second heat generating source, said second heat generating source lying between said second channel and said third channel; and
    said third channel being configured substantially similarly to said first channel.

7. The apparatus of claim 2, wherein said second coolant has substantially the same composition as said first coolant.

8. The apparatus of claim 1, wherein said second side comprises a ceramic material.

9. The apparatus of claim 1, wherein said first side is a smooth sheet of nonmagnetic material.

10. The apparatus of claim 9, wherein said nonmagnetic material is selected from the group consisting of polymers, ceramics, and metals.

11. The apparatus of claim 2, further comprising a plurality of support members connected with and substantially perpendicular to said second side and passing through said first channel and said second channel, said support members being thermally insulated from said second channel.

12. The apparatus of claim 11, wherein a portion of said support members passing through said first channel defines an airfoil.

13. The apparatus of claim 11, wherein a portion of said support members passing through said second channel is thermally insulated by barriers surrounding said portions within said second channel, said barriers being spaced at a distance from said portions and sealed against said sides of said channels.

14. The apparatus of claim 5, further comprising a photolithographic instrument including a wafer positioning stage, said positioning stage configured to be driven by said motor coil array selected from the group consisting of linear motor coil arrays and planar motor coil arrays.

15. The apparatus of claim 1, wherein said first and second sides are substantially parallel to each other, and said first coolant flows in a direction substantially parallel to said first and second sides with a substantially laminar flow.

16. A method of thermally insulating a first surface from a second surface comprising:
    containing a first coolant between said first surface and said second surface;
    flowing said first coolant; and
    providing a thermal boundary layer adjacent said first surface in said first coolant;
    said thermal boundary layer having a thickness less than the distance from said first surface to said second surface over the length of said first surface.

17. The method of claim 16, wherein said first and second surfaces are substantially parallel to each other, and said first coolant flows in a direction substantially parallel to said first surface with a substantially laminar flow.

18. A method of controlling the temperature of an outer surface proximate to a heat generating source, comprising:
    locating said heat generating source in thermal communication with a first channel;
    said first channel having first and second sides;
    providing a first coolant within said first channel;
    flowing said first coolant; and
    providing a thermal boundary layer adjacent said first side in said first coolant;
    said thermal boundary layer having a thickness over the length of said first channel less than the distance from said first side to said second side.

19. The method of claim 18, further comprising locating a second channel in thermal communication with said heat generating source, said heat generating source located between said first channel and said second channel, said second channel containing a second coolant flowing in a direction substantially parallel to said second surface.

20. The method of claim 19, wherein said first coolant has substantially the same composition as said second coolant.

21. The method of claims 19, wherein said second channel provides higher heat transfer than said first channel from said heat generating source.

22. The method of claim 18, wherein said heat generating source includes a motor coil array selected from the group consisting of linear motor coil arrays and planar motor coil arrays.

23. The method of claim 20, wherein said first coolant flows in series through said first channel and then through said second channel.

24. The method of claim 18, wherein said second side is made of a ceramic material.

25. The method of claim 18, wherein said first side is a smooth sheet of a nonmagnetic material.

26. The method of claim 25, wherein said nonmagnetic material is selected from the group consisting of polymers, ceramics, and metals.

27. The method of claim 19, further comprising a plurality of support members connected with and substantially perpendicular to said second side and passing through said first channel and said second channel, said support members being thermally insulated from said second channel.

28. The method of claim 27, wherein a portion of said support members passing through said first channel defines an airfoil.

29. The method of claim 27, wherein a portion of said support members passing through said second channel is thermally insulated by barriers surrounding said portions within said second channel, said barriers being spaced at a distance from said portions and sealed against said second surface and said containment surface.

30. The method of claim 19, wherein said first and second sides are substantially parallel to each other, and said first coolant flows in a direction substantially parallel to said first surface with a substantially laminar flow.

31. A photolithographic instrument including a wafer positioning stage, said positioning stage configured to be driven by a motor coil array selected from the group consisting of linear motor coil arrays and planar motor coil arrays;

said motor coil array comprising a first heat generating source and a cooling system including a first channel;

said first channel having a length and first and second sides and being adapted for a first coolant flowing within said first channel between said first and second sides;

said first coolant having a thermal boundary layer adjacent said first side; and said thermal boundary layer having a thickness over the length of said first channel less than the distance between said first side and said second side.

32. The photolithographic instrument of claim 31, further comprising a second channel, said first heat generating source located between said first channel and said second channel, said second channel being adapted for a second coolant flowing within said second channel.

33. The photolithographic instrument of claim 32, wherein said second coolant has substantially the same composition as said first coolant.

34. The photolithographic instrument of claim 33, wherein said first channel and said second channel are configured such that said first coolant and said second coolant flow in series through said first channel and then through said second channel.

35. The photolithographic instrument of claim 32, wherein said second channel is configured for higher heat transfer than said first channel from said first heat generating source.

36. The photolithographic instrument of claim 32, further comprising:

a second heat generating source located in thermal communication with said second channel;

a third channel in thermal communication with said second heat generating source, said second heat generating source lying between said second channel and said third channel; and said third channel being configured substantially similarly to said first channel.

37. The photolithographic instrument of claim 31, wherein said second side comprises a ceramic material.

38. The photolithographic instrument of claim 31, wherein said first side is a smooth sheet of nonmagnetic material.

39. The photolithographic instrument of claim 38, wherein said nonmagnetic material is selected from the group consisting of polymers, ceramics, and metals.

40. The photolithographic instrument of claim 32, further comprising a plurality of support members connected with and substantially perpendicular to said second side and passing through said first channel and said second channel, said support members being thermally insulated from said second channel.

41. The photolithographic instrument of claim 40, wherein a portion of said support members passing through said first channel defines an airfoil.

42. The photolithographic instrument of claim 40, wherein a portion of said support members passing through said second channel is thermally insulated by barriers surrounding said portions within said second channel, said barriers being spaced at a distance from said portions and sealed against said sides of said channels.

* * * * *